United States Patent [19]

Wrezel

[11] Patent Number: 4,870,138

[45] Date of Patent: Sep. 26, 1989

[54] SEMI-INTERPENETRATING POLYMER NETWORKS

[75] Inventor: James A. Wrezel, Buffalo Grove, Ill.

[73] Assignee: Allied-Signal Inc., Morris Township, Morris County, N.J.

[21] Appl. No.: 852,604

[22] Filed: Apr. 16, 1986

[51] Int. Cl.$^4$ .................. C08F 283/02; C08F 283/04; C08F 283/08

[52] U.S. Cl. .................................. 525/391; 525/392; 525/426; 525/468; 525/536; 525/905

[58] Field of Search ............... 525/391, 392, 905, 426, 525/468, 536; 568/646

[56] References Cited

U.S. PATENT DOCUMENTS 3,356,761 12/1967 Fox ...................................... 525/391
3,586,736 6/1971 Takemura et al. .
4,116,936 9/1978 Steiner ................................ 528/286

Primary Examiner—Jacob Ziegler
Attorney, Agent, or Firm—Raymond H. Nelson; Harold N. Wells; Jay P. Friedenson

[57] ABSTRACT

Novel compositions of matter comprising semi-interpenetrating polymer networks resulting from the reaction between a poly(vinyl benzyl ether) of a polyphenol and engineering condensation thermoplastic may be used as components in a laminate when coated on a reinforcement or substrate. The resulting laminates which may be employed in electric circuit boards will possess desirable electrical and thermal properties as exemplified by a high glass transition temperature and a low dielectric constant.

10 Claims, No Drawings

SEMI-INTERPENETRATING POLYMER NETWORKS

BACKGROUND OF THE INVENTION

With the advent of sophisticated equipment in the electrical and electronic fields, it has become necessary that the components of the various pieces of equipment conform to high standards which are set forth in the specifications for these components. For example, circuit boards which are used in relatively complicated pieces of equipment such as main frame computers, must be of a relatively high standard of quality in order to function in an efficient manner for a longer period of time without deteriorating or breaking down, and thus causing an interruption in the function of the machine. This high quality of material is opposed to pieces of equipment requiring a lower standard of quality such as those used in personal computers, high quality television equipment, radios, etc.

Circuit boards upon which a circuit is etched or implanted usually comprise a laminate which is composed of a synthetic polymeric substance which possesses desirable characteristics such as thermal stability, low coefficient of thermal expansion, dimensional stability, low dielectric constant, solvent resistance, low moisture absorption, etc. and a suitable reinforcement matrix, such as glass, quartz, graphite, Kevlar, etc.

As will hereinafter be shown, it has now been discovered that a semi-interpenetrating polymer network resin may be prepared by admixing a semi-crystalline engineering condensation thermoplastic compound with a poly(vinyl benzyl ether) of a polyphenol. The resulting material will comprise a processable material which contains desirable components, said blend preventing the linear engineering condensation thermoplastic from crystallizing, especially at high cross-linked/linear ratios, inasmuch as the interpenetration will prevent short range stereoregulatity necessary for packing into crystalline lattices. In addition, the presence of the cross-linked poly(vinyl benzyl ether) will serve to reinforce the more ductile engineering condensation thermoplastic.

BRIEF SUMMARY OF THE INVENTION

This invention relates to semi-interpenetrating polymer network resins. More specifically, the invention is concerned with novel high temperature semi-interpenetrating network resins which may be used to coat and/or impregnate a substrate which is thereafter cured and utilized in circuit board laminates and dielectric coatings, the use thereof being attributable to the desirable characteristics which are possessed by these polymeric compositions of matter. The particular characteristics of the polymer dielectric and reinforcing components which go to make up the circuit boards contribute to the efficiency and stability of the final electronic equipment in which the circuit boards are used. For example, a lowering of the dielectric constant in the polymer matrix reduces the signal delay time or "crosstalk" and line capacitance. This results in faster PWB circuitry and, in addition, provides a potential to increase the number of functions per board. The polymeric matrix of the present invention possesses a lower dielectric constant than that which is possessed by thermosetting polyimide or epoxy matrices which are used as the standards by the industry for electrical laminates.

Another desirable characteristic of a polymer matrix for use in circuit boards is that the coefficient of thermal expansion should be relatively low in order to avoid a mismatch of thermal expansions with the electronic components and the fiberglass reinforcement with which the polymeric matrix is composited. Furthermore, the thermal stability of the polymer matrix must be relatively high in nature, inasmuch as the matrix must possess the ability to withstand soldering temperatures without melting or degrading. A desirable characteristic of the semi-interpenetrating polymer network resin of the present invention is that the thermal stability of the polymer is comparable to a polyimide matrix.

The semi-interpenetrating polymer network resin which results from the mixture of an engineering condensation thermoplastic compound and a poly(vinyl benzyl ether) of a polyphenol results in the cross-linking or formation of a network which renders the polymer resistant to dissolution or decomposition, due to the action of a solvent on the circuit board which forms one of the end products in which the novel composition may be employed. This is of particular importance when a solvent such as methylene chloride is employed in the subsequent vapor degreasing process during the soldering stage in copper clad or multilayer boards.

It is therefore an object of this invention to provide semi-interpenetrating polymer network resins.

Another object of this invention is to prepare semi-interpenetrating polymer network resins which are useful as a component in circuit board laminates.

In one aspect, an embodiment of this invention resides in a semi-interpenetrating polymer network comprising an engineering condensation thermoplastic in admixture with a poly(vinyl benzyl ether) of polyphenol having the generic structure of:

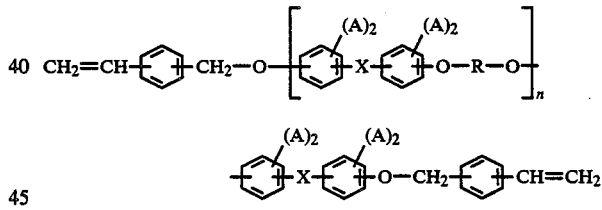

in which X is selected from the group consisting of

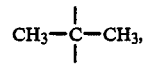

—SO$_2$—, —O—, —CH$_2$—, and —S— radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$— and —CH$_2$—C≡C—CH$_2$— radicals, A is independently selected from the group consisting of hydrogen, chlorine, bromine, fluorine, alkyl, alkoxy and phenyl radicals, and n has an average value in the range of from 0 to about 20.

Other objects and embodiments will be found in the following further detailed description of the invention.

DETAILED DESCRIPTION OF THE INVENTION

As was hereinbefore set forth, the present invention is concerned with novel semi-interpenetrating polymer networks. These networks will comprise a mixture of a poly(vinyl benzyl ether) of a polyphenol and an engineering condensation thermoplastic, some examples of these compounds being hereinafter set forth in greater detail. In the electronic equipment area, it is necessary to utilize, as circuit boards in electronic circuitry, compositions of matter which possess desirable characteristics. The circuit boards are usually comprised of laminates in which a resin is impregnated on a reinforcement or substrate such as glass cloth, paper, etc. The various resins which are employed to provide the circuitry may be from many original sources. For example, thermosets are resins which require a curing step. In general, the thermoset plastics possess a good resistance to the action of solvents. However, they also possess an undesirable characteristic in that their low resin tensile strength and fracture toughness limits the design strength capability of the resin to a certain degree. Another type of polymer which may be employed comprises a thermoplastic type of polymer which possesses a greater degree of toughness than does the thermoset resin without any sacrifice of stiffness. However, while this is a desirable characteristic, the thermoplastic also has an inherent disadvantage in that most thermoplastics must be heated to or above the melting point of the plastic in order to provide sufficient viscosity to allow a processing of said plastic. Furthermore, another inherent disadvantage is that a relatively few number of thermoplastics possess a use temperature of 200° C. or greater. Finally, most thermoplastics are extremely solvent-sensitive, limiting their use to only specific application areas.

In order to overcome the disadvantages which are possessed by the various types of polymers, it is necessary to provide a combination of polymers. One type of combination of polymers comprises an interpenetrating polymer network (IPN) which may be defined as a combination of two polymers in network form, at least one of which is synthesized and/or cross-linked in the immediate presence of the other. In full IPN's, both components of the network are cross-linked; the phases of both components of the network being continuous, and thus interpenetrating each other. In contrast to this, a semi-interpenetrating polymer network may be defined as a material system which possesses two continuous phases; however, only one of the two phases being cross-linked.

In this respect, it has now been discovered that a semi-interpenetrating polymer network which combines an engineering condensation thermoplastic may be combined with an addition-curable engineering oligomer such as a poly(vinyl benzyl ether) of a polyphenol to provide a resin which may be processed in a relatively easy manner without sacrificing such desirable characteristics as high Tg, low dielectric constant and loss, chemical resistance to the action of solvents such as methylene chloride etc. These semi-interpenetrating polymer networks will comprise a high performance, high use temperature, chemically unique material system. The poly(vinyl benzyl ether) which forms one component of the semi-interpenetrating polymer network of the present invention will possess the generic structure:

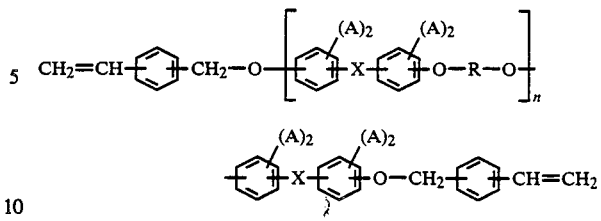

in which X is selected from the group consisting of

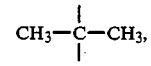

—SO$_2$—, —O—, —CH$_2$—, and —S— radicals, R is selected from the group consisting of —CH$_2$—C$_6$H$_4$—CH$_2$—, (CH$_2$)$_b$ in which b ranges from 1 to about 6, —CH$_2$—CH=CH—CH$_2$— and —CH$_2$—C≡C—CH$_2$— radicals, A is independently selected from the group consisting of hydrogen, chlorine, bromine, fluorine, alkyl, alkoxy and phenyl radicals, and n has an average value in the range of from 0 to about 20.

The second component of the semi-interpenetrating polymer network of the present invention will comprise a polymer which may be generically referred to as an engineering condensation thermoplastic. This component of the network will contribute to the glass transition temperature, crystallinity, and processability of the finished compound. Some examples of egineering condensation thermoplastic components which may be employed will include polphenylene oxide, substituted-polyphenylene oxides, polyphenylene sulfide, polysulfone, polyether sulfone, polycarbonate, substituted-polycarbonates, polyether imide, etc.

The desired semi-interpenetrating polymer networks of the present invention may be prepared in any suitable manner of operation which is known in the art. For example, one method of preparation involves admixing the poly(vinyl benzyl ether) of a polyphenol with the engineering condensation thermoplastic compound in a mutually miscible solvent such as aromatic hydrocarbons including toluene, benzene, the isomeric xylenes, etc., dimethyl formamide, N-methyl pyrrolidinone, acetone, etc. The resulting mixture can then be poured into a suitable mold and utilized as a molded article of commerce after heating to remove the solvent and curing at elevated temperature. Or, if so desired, the solution may be coated on an appropriate reinforcement or substrate such as glass cloth, paper, graphite, polyaramids, and treated at an elevated temperature ranging from about 30° C. to about 180° C. for a relatively short period of time which may range from about 1 to about 10 minutes, to obtain a prepreg with low solvent content. The resulting prepreg may then be stacked by pressing a predetermined number of sheets of the prepreg and pressing the stack in a heated press to form a desired laminate. The pressing of the prepreg may be effected for a period of time ranging from about 1 to 4 hours in duration at an elevated temperature ranging from about 150° to about 190° C., at a pressure in the range of from about 500 to about 1,000 pounds per square inch gauge. Following the pressing, the laminate is then subjected to a post-cure which is effected at a temperature in the range of from about 200° to about 260° C. for a period of time which may range from about 3 to about 6 hours in duration.

The two components of the mixture may be present in varying amounts, which may range from about 0.1 to about 99.9% by weight of engineering condensation thermoplastic compound and about 99.9% to about 0.1% by weight of the poly(vinyl benzyl ether) of a polyphenol. In the present embodiment of the invention, the two compounds will be present in the range of from about 10% to about 90% by weight of thermoplastic compound and about 90% to about 10% by weight of the ether compound, the more preferable range being from about 25% to about 75% by weight of each compound. The amounts of each component of the semi-interpenetrating polymer network may vary according to the particular characteristic of the desired finished compound or resin. As was hereinbefore set forth, it is possible to tailor the processability and properties of the semi-interpenetrating polymer network by varying the amounts of components inasmuch as the engineering condensation thermoplastic compound will add ductility, impact toughness, and tensile strength, and improve prepreg resin content, while the poly(vinyl benzyl ether) of a polyphenol will raise the glass transition temperature without significantly affecting the dielectric constant, and improve chemical tolerance, as well as serving as a plasticizer of the mixture prior to the curing step.

The following examples are given for purposes of illustrating the semi-interpenetrating network compounds of the present invention. However, it is to be understood that these examples are given merely for purposes of illustration and that the present invention is not necessarily limited thereto.

EXAMPLE I

Semi-interpenetrating polymer network blends were prepared containing various proportions of poly(2,6-dimethyl-1,4 phenylene oxide) [PPO] and styrene-encapped bisphenol A (styrene-encapped p,p'-isopropylidenediphenol) [STBPA] utilizing chloroform as a solvent for each of the components. The blends were prepared to contain 75% by weight of STBPA and 25% by weight of PPO; a 50/50 wt. % mixture of the two components, and a 25 wt. % STBPA/75 wt % PPO blend. The mixtures were poured into aluminum dishes and cured under a nitrogen atmosphere, first at a temperature of 100° C. which was then raised slowly to 170° C. to prevent bubbling. The temperature was maintained at 170° C. for a period of 8 hours, and thereafter post-baked at a temperature of 200° C. for a period of 1 hour. All of the samples were homogeneous in nature and transparent. Analyses of these samples showed a single Tg (by Differential Scanning Calorimetry) of 210° C. and a dielectric constant of 2.7 1 MHz (23° C.).

EXAMPLE II

In this example, three blends containing the same proportion of STBPA and PPO as set forth in Example I above, were prepared using chloroform as the common solvent. Each mixture was coated on a fiberglass woven fabric which was then heated to a temperature of 100° C. to volatilize the solvent. The impregnated cloth was then cured at a temperature of 170° C. for a period of 8 hours, followed by post-curing at a temperature of 200° C. for a period of 4 hours. DSC analysis indicated that each cured material had a single Tg of 210° C. with no observed crystallinity from the thermoplastic component.

EXAMPLE III

In a manner similar to that set forth in the above examples, poly(2,6-dimethyl-1,4 phenylene oxide) may be dissolved in chloroform and blended with a solution of tetrabromobisphenol A, also dissolved in chloroform. The resulting solution may then be coated on a substrate such as glass cloth, heated to remove the chloroform solvent, and cured at temperatures ranging from 170° C. to about 200° C. to provide laminates which may then be used in the production of circuit boards for electric or electronic equipment.

EXAMPLE IV

In this example, a polyphenylene oxide and tetramethylbisphenol A may be dissolved in a mutually miscible solvent comprising dimethyl formamide (DMF). The resulting solution may then be impregnated on a substrate such as graphite which is thereafter heated to remove the solvent and cured at a temperature of about 170° C. The resulting prepreg may then be post-cured at a temperature of about 210° C. to obtain the desired laminate.

We claim as our invention:

1. A semi-interpenetrating polymer network consisting of an engineering condensation thermoplastic in admixture with a poly(vinyl benzyl ether) of polyphenol having the generic structure of:

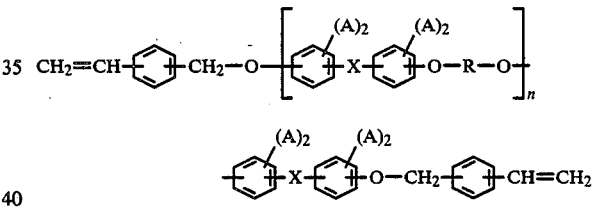

in which X is selected from the group consisting of

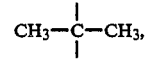

—$SO_2$—, —O—, —$CH_2$—, and —S— radicals, R is selected from the group consisting of —$CH_2$—$C_6H_4$—$CH_2$—, $(CH_2)_b$ in which b ranges from 1 to about 6, —$CH_2$—CH=CH—$CH_2$— and —$CH_2$—C≡C—$CH_2$— radicals, A is independently selected from the group consisting of hydrogen, chlorine, bromine, fluorine, alkyl, alkoxy, and phenyl radicals, and n has an average value in the range of from 0 to about 20, said semi-interpenetrating network being formed by solution polymerization.

2. A semi-interpenetrating polymer network as set forth in claim 1 in which said engineering condensation thermoplastic is selected from the group consisting of polyphenylene oxides, polysulfone, polyether sulfone, polycarbonates and polyether imides.

3. A semi-interpenetrating polymer network as set forth in claim 1 in which said engineering condensation thermoplastic is present in said network in a range of from about 0.1% to about 99.9% by weight of said network.

4. A semi-interpenetrating polymer network as set forth in claim 1 in which said poly(vinyl benzyl ether) of a polyphenol is present in said network in a range of from about 99.9L % to about 0.1% by weight of said network.

5. A semi-interpenetrating polymer network as set forth in claim 3 in which said engineering condensation thermoplastic is present in said network in a range of from about 25% to about 75% by weight of said network.

6. A semi-interpenetrating polymer network as set forth in claim 4 in which said poly(vinyl benzyl ether) of a polyphenol is present in said network in a range of from about 75% to about 25% by weight of said network.

7. A semi-interpenetrating polymer network as set forth in claim 2 in which said polyphenylene oxide is poly(2,6-dimethyl-1,4-phenylene oxide).

8. A semi-interpenetrating polymer network as set forth in claim 1 in which said poly(vinyl benzyl ether) of a polyphenol is styrene-encapped bisphenol A.

9. A semi-interpenetrating polymer network as set forth in claim 1 in which said poly(vinyl benzyl ether) of a polyphenol is tetrabromobisphenol A.

10. A semi-interpenetrating polymer network as set forth in claim 1 in which said poly(vinyl benzyl ether) of a polyphenol is tetramethylbisphenol A.

* * * * *

UNITED STATES PATENT AND TRADEMARK OFFICE
CERTIFICATE OF CORRECTION

PATENT NO. : 4,870,138
DATED : September 26, 1989
INVENTOR(S) : James A. Wrezel

It is certified that error appears in the above-identified patent and that said Letters Patent is hereby corrected as shown below:

Column 1, line 40: "stereoregulatity" should read --stereoregularity--
Column 2, line 55,56: "consisting of $-CH_2-CH_6H_4-$" should read -- consisting of $-CH_2-C_6H_4-$ --
Column 5, line 56: "2.7 1MHz" should read -- 2.7 @ 1MHz --
Column 7, line 5: "99.9L %" should read --99.9 %--

Signed and Sealed this

Twenty-third Day of October, 1990

Attest:

HARRY F. MANBECK, JR.

Attesting Officer

Commissioner of Patents and Trademarks